United States Patent
Ishii et al.

(10) Patent No.: US 7,182,606 B2
(45) Date of Patent: Feb. 27, 2007

(54) WIRED CIRCUIT BOARD

(75) Inventors: Jun Ishii, Osaka (JP); Hitoki Kanagawa, Osaka (JP); Yasuhito Funada, Osaka (JP)

(73) Assignee: Nitto Denko Corporation, Ibaraki (JP)

( * ) Notice: Subject to any disclaimer, the term of this patent is extended or adjusted under 35 U.S.C. 154(b) by 0 days.

(21) Appl. No.: 11/365,845

(22) Filed: Mar. 2, 2006

(65) Prior Publication Data

US 2006/0199402 A1 Sep. 7, 2006

(30) Foreign Application Priority Data

Mar. 2, 2005 (JP) .............................. 2005-057704

(51) Int. Cl.
*H01R 12/00* (2006.01)
(52) U.S. Cl. ......................... 439/66; 174/261
(58) Field of Classification Search ................ 439/66; 174/257, 256, 261, 250, 255
See application file for complete search history.

(56) References Cited

U.S. PATENT DOCUMENTS

| | | | |
|---|---|---|---|
| 5,612,512 A * | 3/1997 | Wakamatsu et al. | 174/260 |
| 6,147,876 A * | 11/2000 | Yamaguchi et al. | 361/766 |
| 6,162,996 A * | 12/2000 | Schmidt et al. | 174/259 |
| 6,242,103 B1 * | 6/2001 | Farnworth et al. | 428/458 |
| 6,399,899 B1 * | 6/2002 | Ohkawa et al. | 174/261 |
| 7,013,561 B2 * | 3/2006 | Nakatani et al. | 29/852 |
| 7,067,912 B2 * | 6/2006 | Takeuchi et al. | 257/688 |
| 2004/0173375 A1 * | 9/2004 | Lee et al. | 174/250 |
| 2004/0245015 A1 * | 12/2004 | Yoshimi et al. | 174/263 |
| 2004/0252413 A1 | 12/2004 | Nishiyama | |
| 2005/0122627 A1 * | 6/2005 | Kanagawa et al. | 360/245.9 |
| 2005/0186332 A1 * | 8/2005 | Funada et al. | 427/96.1 |

FOREIGN PATENT DOCUMENTS

JP     2005-11387     1/2005

* cited by examiner

*Primary Examiner*—Michael C. Zarroli
(74) *Attorney, Agent, or Firm*—Jean C. Edwards, Esq.; Akerman Senterfitt

(57) ABSTRACT

A wired circuit board that can provide a reduced transmission loss and an improved adhesion strength between a metal suspension board and a metal foil with a simple laminar structure, thereby ensuring improved long-term reliability. The wired circuit board 1 comprises a metal suspension board 2, a thin metal film 3 formed on the metal suspension board 2 by sputtering or by electrolytic plating, a metal foil 4 formed on the thin metal film 3 by electrolytic plating, an insulating base layer 5 formed on the metal foil 4 and the metal suspension board 2, and a conductive pattern 6 formed on the insulating base layer 5 as a wired circuit pattern. The wired circuit board 1 may include an insulating cover layer 7 formed on the insulating base layer 5 to cover the conductive pattern 6.

5 Claims, 2 Drawing Sheets

(a)

(b)

(c)

(d)

(e)

(f)

(g)

WIRED CIRCUIT BOARD

CROSS REFERENCE TO RELATED APPLICATION

This application claims priority from Japanese Patent Appln. No. 2005-57704, filed Mar. 2, 2005, the contents of which are herein incorporated by reference in their entirety.

BACKGROUND OF THE INVENTION

1. Field of the Invention

The present invention relates to a wired circuit board and, more particularly, to a wired circuit board including, for example, a suspension board with circuits and the like.

2. Description of the Prior Art

A suspension board with a circuit is generally known to include an insulating layer formed of resin and a conductive pattern formed of copper which are sequentially formed on a metal suspension board formed of stainless steel.

This conventional suspension board with a circuit exhibits greater transmission loss in the conductive pattern due to the metal suspension board formed of stainless steel.

Prior art devices proposes solution to reduce the transmission loss, according to which after a lower conductor of copper or a copper alloy consisting primarily of copper is formed on the suspension board of stainless steel, an insulating layer, a record-side conductor, and a reproduction-side conductor are sequentially formed on the lower conductor (JP Laid-open (Unexamined) Patent Publication No. 2005-11387, for example).

However, this proposal has the disadvantage that adhesion between the suspension board and the lower conductor is insufficient, so that it is difficult to ensure long-term reliability.

SUMMARY OF THE INVENTION

It is an object of the present invention to provide a wired circuit board that can provide a reduced transmission loss and an improved adhesion strength between a metal suspension board and a metal foil with a simplified laminar structure, thereby providing improved long-term reliability.

The present invention provides a novel wired circuit board comprising a metal suspension board, a thin metal film formed on the metal suspension board, a metal foil formed on the thin metal film, an insulating layer formed on the metal foil, and a conductive pattern formed on the insulating layer.

In the wired circuit board of the present invention, it is preferable that the metal suspension board is formed of stainless steel and the metal foil is formed of copper.

In the wired circuit board of the present invention, it is preferable that the thin metal film is formed by sputtering or by electrolytic plating and the metal foil is formed by electrolytic plating.

In the wired circuit board of the present invention, it is preferable that the wired circuit board is a suspension board having a circuit.

According to the wired circuit board of the present invention, since the thin metal film is formed between the metal suspension board and the metal foil, the transmission loss in the conductive pattern can be reduced and also sufficient adhesion strength between the metal suspension board and the metal foil can be provided with a simple laminar structure wherein only the thin metal film is made to intervene between the metal suspension board and the metal foil, ensuring improved long-term reliability.

DETAILED DESCRIPTION OF THE PREFERRED EMBODIMENT

Figure 1:
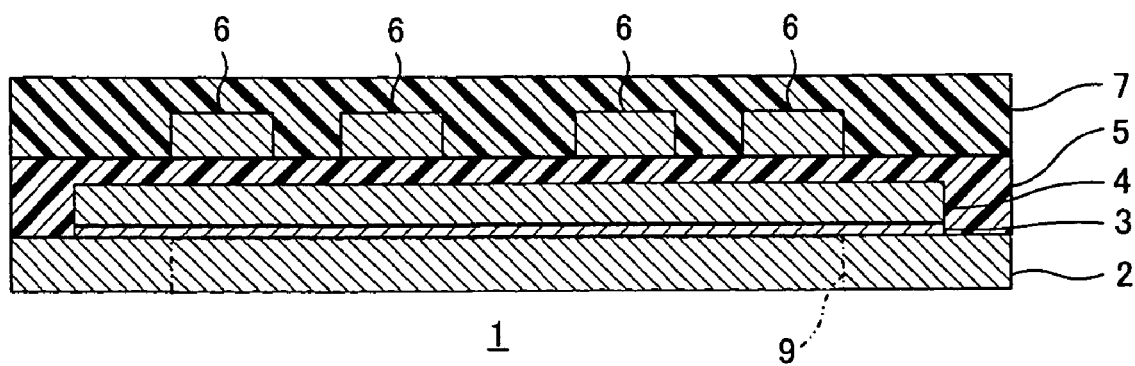
FIG. 1 is a sectional view of a principal part of a wired circuit board of an embodiment of the present invention.

FIG. 1 is a sectional view of a principal part of a wired circuit board of the present invention.

A wired circuit board 1 shown in FIG. 1 is a suspension board with circuit to be mounted on a hard disc drive. The wired circuit board 1 comprises a metal suspension board 2 extending in a longitudinal direction, a thin metal film 3 formed on the metal suspension board 2, a metal foil 4 formed on the thin metal film 3, an insulating base layer 5 formed on the metal foil 4 as an insulating layer, a conductive pattern 6 formed on the insulating base layer 5, and an insulating cover layer 7 formed over the conductive pattern 6 on an as-needed basis.

The metal suspension board 2 is formed of a planar metal foil or thin planar metal sheet. The metals that may be used for forming the metal suspension board 2 include, for example, stainless steel and 42-alloy. Preferably, stainless steel is used for the metal suspension board 2. It is preferable that the metal suspension board 2 has thickness of 15–30 µm, or preferably 20–25 µm.

The thin metal film 3 is in the form of a pattern and formed on a surface of the metal suspension board 2 to correspond to an area thereof where the metal foil 4 is formed. The metals that may be used for forming the thin metal film 3 include, for example, chromium, gold, silver, platinum, nickel, titanium, silicon, manganese, zirconium, and alloys thereof or oxides thereof. The thin metal film 3 has thickness of e.g. 0.01–1 µm, or preferably 0.1–1 µm.

In consideration of adhesion between the metal suspension board 2 and the metal foil 4, the thin metal film 3 may be in the form of a multilayer film comprising, for example, a first thin metal film 3' formed of a metal having a high adhesion strength to the metal suspension board 2 and formed on the surface of the metal suspension board 2, and a second thin metal layer 3" formed of a metal having a high adhesion strength to the metal foil 4 and laminated on the surface of the first thin metal film 3'.

The metal foil 4 is in the form of a pattern and formed on a surface of the thin metal film 3 to correspond to at least an area thereof where the conductive pattern 6 is formed. Copper is preferably used for forming the metal foil 4. The metal foil 4 has thickness of e.g. 2–5 µm, or preferably 2–4 µm.

The insulating base layer 5 is formed on a surface of the metal suspension board 2 to cover the metal foil 4. Insulating materials that may be used for forming the insulating base layer 5 include, for example, synthetic resins commonly used for the insulating member of the wired circuit board, such as, polyimide, polyether nitrile, polyether sulfone, polyethylene terephthalate, polyethylene naphthalate, and polyvinyl chloride. Of these synthetic resins, a photosensitive synthetic resin, or preferably photosensitive polyimide, is preferably used for the insulating base layer 5. The insulating base layer 5 has thickness of e.g. 5–15 µm, or preferably 8–10 µm.

The conductive pattern 6 is formed on a surface of the insulating base layer 5 to be in the form of a wired circuit pattern configured by a plurality of lines of wire (e.g. four lines of wire) arranged in parallel and spaced apart from each other along the longitudinal direction. Conductors that may be used for forming the conductive pattern 6 include, for example, metals commonly used for the conductor of the wired circuit board, such as, copper, nickel, gold, solder, or alloys thereof Of these metals, copper is preferably used for the conductive pattern 6. The conductive pattern 6 has thickness of e.g. 5–20 µm, or preferably 7–15 µm. Also, a width of each line of wire is in the range of e.g. 15–100 µm, or preferably 20–50 µm, and a space between adjacent lines of wire is in the range of e.g. 15–100 µm, or preferably 20–50 µm.

The insulating cover layer 7 is formed on a surface of the insulating base layer 5, to cover the conductive pattern 6. The same insulating materials as those used for forming the insulating base layer 5 may be used for forming the insulating cover layer 7. The insulating cover layer 7 has thickness of e.g. 3–10 µm, or preferably 4–5 µm.

Figure 2:
FIG. 2 is a production process drawing showing a production method of the wired circuit board shown in FIG. 1, (a) showing the process of forming a thin metal film on a metal suspension board by sputtering or by electrolytic plating, (b) showing the process of forming a resist on the thin metal film, to have a reverse pattern to a pattern of the metal foil, (c) showing the process of forming a metal foil on the thin metal film exposed from the resist by electrolytic plating, (d) showing the process of removing the resist and the thin metal film in the region where the resist was formed, (e) showing the process of forming an insulating base layer on the metal suspension board including the metal foil, (f) showing the process of forming a conductive pattern on the insulating base layer, (g) showing the process of forming an insulating cover layer on the insulating base layer, to cover the conductive pattern.
Figure 2:
Figure 2:
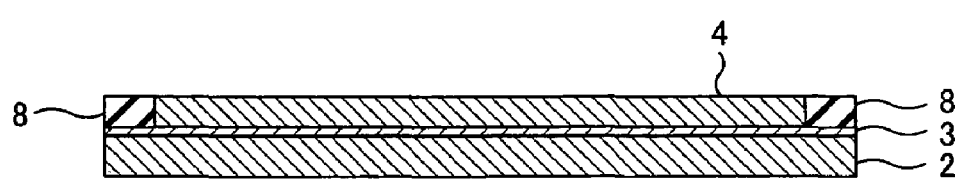
Figure 2:
Figure 2:
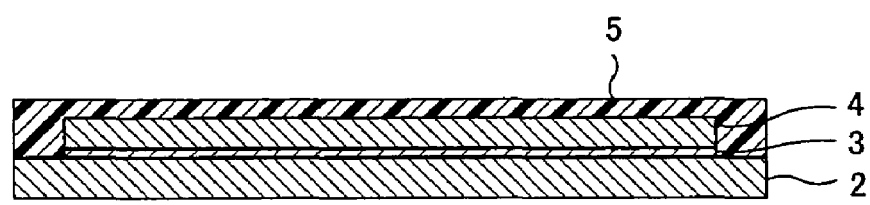
Figure 2:
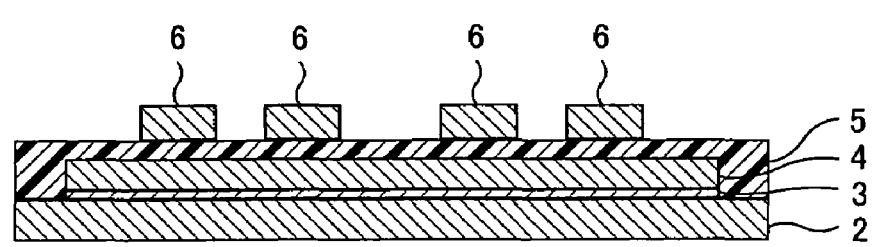
Figure 2:
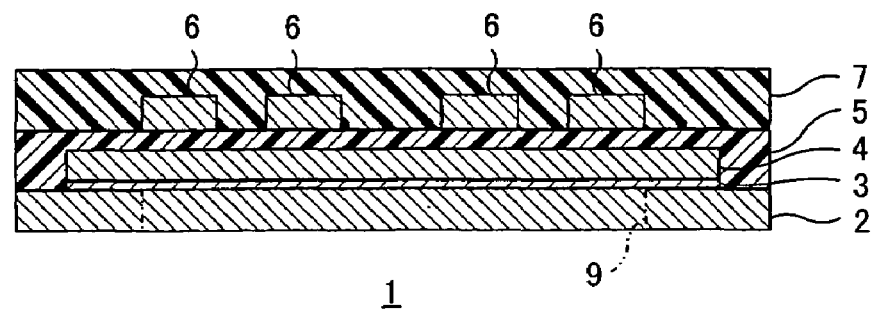

This wired circuit board 1 can be produced by the method shown in FIG. 2, for example.

First, the metal suspension board 2 is prepared and, then, the thin metal film 3 is formed on the entire surface of the metal suspension board 2 by sputtering or by electrolytic plating, as shown in FIG. 2(*a*).

Then, a resist 8 is formed to have a reverse pattern to a pattern of the metal foil 4, as shown in FIG. 2(*b*). The resist 8 is formed by a known method using e.g. a photosensitive dry film resist for exposure to light and development.

Then, the metal foil 4 is formed on the entire surface of the thin metal film 3 exposed from the resist 8 by electrolytic plating, or preferably by electrolytic copper plating, using the resist 8 as the plating resist, as shown in FIG. 2(*c*).

Then, the resist 8 and the thin metal film 3 in an area thereof where the resist 8 was formed are removed by a known etching process, such as a chemical etching (wet etching), or by stripping, as shown in FIG. 2(*d*).

Then, for example solution (varnish) of the synthetic resin cited above is uniformly coated over the surfaces of the metal foil 4 and the metal suspension board 2 and then dried. Then, it is cured by the application of heat, if necessary. The insulating base layer 5 of synthetic resin is formed in the manner mentioned above. Alternatively, the insulating base layer 5 may be formed to be in the form of a pattern by exposing the photosensitive synthetic resin to light and developing it. Further, the method for forming the insulating base layer 5 is not limited to the method mentioned above. The insulating base layer 5 may be formed, for example, by the method that after a synthetic resin is previously formed in film form, the resulting film is adhesively bonded to the surfaces of the metal foil 4 and the metal suspension board 2 via a known adhesive layer.

Then, the conductive pattern 6 is formed in the wired circuit pattern mentioned above by a known patterning process such as the additive process or the subtractive process, as shown in FIG. 2(*f*).

For example, when the conductive pattern 6 is formed by the additive process, a thin conductive film serving as a ground layer is formed on the entire surface of the insulating base layer 5 by the vacuum film forming or by the sputtering, for example, first. Then, a surface of the thin conductive film thus formed is exposed to light using the photosensitive dry film resist and the like and then developed, to form the plating resist having a reverse pattern to the wired circuit pattern. Then, the conductive pattern 6 is formed on the surface of the thin conductive film exposed from the plating resist by plating, to be in the form of the wired circuit pattern. Then, the plating resist and the thin conductive film in the area where the plating resist was formed are removed by etching and the like. Although both the electrolytic plating and the electroless plating may be used for forming the conductive pattern 6, the electrolytic plating is preferably used. Particularly, the electrolytic copper plating is preferably used.

On the other hand, when the conductive pattern 6 is formed by the subtractive process, a conductor layer is formed over the entire surface of the insulating base layer 5, first. Any particular limitation is not imposed on the formation of such a conductor layer. For example, the conductor layer may be adhesively bonded to the entire surface of the insulating base layer 5 via a known adhesive layer, first. Then, the conductor layer is subjected to exposure to light and development, using the photosensitive dry film resist, to form an etching resist having the same pattern as the wired circuit pattern on the surface of the conductor layer. Then, after the conductor layer exposed from the etching resist is removed by etching (wet etching), the etching resist is removed.

Then, for example the solution of the synthetic resin cited above is uniformly coated over the surfaces of the insulating base layer 5 to cover the conductive pattern 6 and then dried. Then, it is cured by the application of heat, if necessary. The insulating cover layer 7 of synthetic resin is formed in the manner mentioned above, as shown in FIG. 2(*g*). The wired circuit board 1 is obtained in the manner mentioned above. Alternatively, the insulating cover layer 7 may be formed to be in the form of a pattern by exposing the photosensitive synthetic resin to light and developing it. Further, the method for forming the insulating cover layer 7 is not limited to the method mentioned above. The insulating cover layer 7 may be formed, for example, by the method that after a synthetic resin is previously formed in film form, the resulting film is adhesively bonded to the surfaces of the insulating base layer 5 to cover the conductive pattern 6 via the known adhesive layer.

The insulating cover layer 7 is formed so that the conductive pattern 6 can be exposed from the insulating cover layer 7 at its portion serving to be a terminal portion of the conductive pattern 6 by the patterning process using the photosensitive synthetic resin or by the boring process using laser or punching, though not shown.

In the wired circuit board 1 thus obtained, the metal foil 4 is laminated on the metal suspension board 2 via the thin metal film 3, as shown in FIG. 1. This arrangement can produce the following result. Although the conventional arrangement wherein no other member than the metal suspension board 2 lies under the conductive pattern 6 provides an increased transmission loss in the conductive pattern 6 confronting the metal suspension board 2, the arrangement of the present invention wherein the metal foil 4 is interposed between the metal suspension board 2 and the conductive pattern 6 can provide a reduced transmission loss in the conductive pattern 6. Further, since metal foil 4 is provided on the metal suspension board 2 simply through the intervention of the thin metal film 3, a sufficient adhesion strength between the metal suspension board 2 and the metal foil 4 can be provided with a simple laminar structure, thereby ensuring improved long-term reliability.

If necessary, in order to adjust the characteristic impedance, an opening 9 may be formed in the wired circuit board 1 by cutting out the metal suspension board 2 to a desired shape by etching, as shown in FIG. 1.

In the conventional wired circuit board wherein the metal foil 4 is laminated directly on the metal suspension board 2, when the opening 9 is formed in the metal suspension board 2 by etching, as mentioned above, the metal foil 4 is also etched disadvantageously.

In contrast with this, in the wired circuit board 1 of the present invention wherein the thin metal film 3 is laminated on the metal suspension board 2 and also the metal foil 4 is laminated on the thin metal film 3, when the opening 9 is formed in the metal suspension board 2 by etching, the thin metal film 3 can serve as a barrier layer to prevent the metal foil 4 from being etched.

EXAMPLES

While in the following, the present invention will be described in further detail with reference to Examples and Comparative Examples, the present invention is not limited thereto.

Example 1

A thin chromium film of 0.03 μm thick and a thin copper film of 0.07 μm thick, each serving as a thin metal film, were sequentially formed on a metal suspension board of stainless steel of 25 μm thick by sputtering (Cf. FIG. 2(*a*)). Then, a plating resist of a pattern to be reverse to a pattern of the metal foil was formed on the thin metal film by using a photosensitive dry film resist (Cf. FIG. 2(*b*)). Then, a copper foil of 4.0 μm thick, serving as the metal foil, was formed on the entire surface of the thin metal film exposed from the plating resist by electrolytic copper plating (Cf. FIG. 2(*c*)). Then, the plating resist and the thin metal film in an area thereof where the plating resist was formed were removed by a chemical etching (Cf. FIG. 2(*d*)). Then, after a varnish of a photosensitive polyamic acid resin was coated over the surface of the metal foil and the surface of the metal suspension board, the coating was exposed to light and then developed and further cured by the application of heat. As a result of this, an insulating base layer of polyimide resin of 10 μm thick was formed in the form of a pattern to cover the entire surface of the metal foil (Cf. FIG. 2(*e*)). Then, a conductive pattern of 10 μm thick was formed in the form of a wired circuit pattern on the insulating base layer by the additive process (Cf. FIG. 2(*f*)). Further, after the varnish of the photosensitive polyamic acid resin was coated over the insulating base layer to cover the conductive pattern, the coating was exposed to light and developed and further cured by the application of heat. As a result of this, an insulating cover layer of polyimide resin of 5 μm thick was formed in the form of a pattern to cover the entire surface of the conductive pattern (except terminal portions) (Cf. FIG. 2(*g*)). Then, after the terminal portions were plated with gold, the metal suspension board was cut out to a desired shape by etching it. A suspension board with circuit was obtained in the manner mentioned above.

Example 2

Except that a thin nickel-chromium-alloy film of 0.03 μm thick was substituted for the thin metal films used in Example 1, the same operations as those in Example 1 were made to thereby produce a suspension board with circuit.

Example 3

Except that an electrolytic gold plating film (formed by electrolytic gold plating) of 1 μm thick was substituted for the thin metal films used in Example 1, the same operations as those in Example 1 were made to thereby produce a suspension board with circuit.

Comparative Example 1

Except that a copper foil was formed directly on the metal suspension board by electrolytic copper plating, without forming the thin metal film therebetween, the same operations as those in Example 1 were made to thereby produce a suspension board with circuit.

Comparative Example 2

Except that the thin metal film and the metal foil were not formed, the same operations as those in Example 1 were made to thereby produce a suspension board with circuit.

Evaluation (Evaluation on Etching of Copper Foil)

When the metal suspension boards of the suspension boards with circuit obtained in Examples and Comparative Examples were etched respectively to form an opening of a predetermined shape therein, in order to adjust the characteristic impedance, it was confirmed that the thin metal film formed in Examples 1–3 functioned as a barrier layer to prevent the copper foil of the metal foil in Examples 1–3 from being etched, while on the other hand, the copper foil of the metal foil in Comparative Example 1 was etched.

(Evaluation on Transmission Efficiency)

Output signal strength ($P_{OUT}$) and input signal strength ($P_{IN}$) in each of the suspension boards with circuit obtained in Examples and Comparative Examples were measured, and the transmission efficiency was evaluated using a ratio of the output signal strength to the input signal strength, as shown in the following equation (1):

$$\text{Transmission Efficiency (\%)} = P_{OUT}/P_{IN} \qquad (1)$$

(Evaluation on Adhesion Strength)

The metal suspension boards of the suspension boards with circuit obtained in Examples and Comparative Examples were allowed to stand under the condition of −40° C. and then were allowed to stand under the condition of 120° C. Taking this as one temperature cycle, the suspension boards with circuit were tested until after the elapse of 1,000 cycles of the temperature cycle, so that the adhesion strength between the metal suspension board and the metal foil was evaluated using the tape stripping. The results are shown in TABLE 1.

TABLE 1

|  | Example 1 | Example 2 | Example 3 | Comparative Example 1 | Comparative Example 2 |
|---|---|---|---|---|---|
| Transmission Efficiency ($P_{OUT}/P_{IN}$) (%) | 79.1 | 78.5 | 79.0 | 78.0 | 55.0 |
| Adhesion strength (Long-term reliability) | ○ | ○ | ○ | x | — |

* Evaluation (○: Tape stripping was not observed; x: Tape stripping was observed)

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising a metal suspension board, a thin metal film formed on the metal suspension board, a metal foil formed on the thin metal film, an insulating layer formed on the metal foil, and a conductive pattern formed on the insulating layer.

2. The wired circuit board according to claim 1, wherein the metal suspension board is formed of stainless steel and the metal foil is formed of copper.

3. The wired circuit board according to claim 1, wherein the thin metal film is formed by sputtering or by electrolytic plating and the metal foil is formed by electrolytic plating.

4. The wired circuit board according to claim 1, wherein the wired circuit board is a suspension board with circuit for mounting on a hard disk drive.

5. A wired circuit board comprising:
a metal suspension board formed of stainless steel having a thickness of 15–30 μm,
a thin metal film formed of chromium, copper, gold, alloys thereof or oxides thereof having a thickness of 0.01–1 μm which is formed on the metal suspension board,
a metal foil formed of copper having a thickness of 2–5 μm which is formed on the thin metal film,
an insulating layer formed of polyimide having a thickness of 5–15 μm which is formed on the metal foil, and
a conductive pattern formed of copper having a thickness of 5–20 μm which is formed on the insulating layer.

* * * * *